March 22, 1960 Y. SELER 2,930,000

VOLUME CONTROL CIRCUIT

Filed Jan. 22, 1957 2 Sheets-Sheet 1

INVENTOR.
Yuksel Seler
BY Donald W. Phillion
HIS ATTORNEY

INVENTOR.
Yuksel Seler
BY Donald W. Phillion
HIS ATTORNEY 2,930,000

VOLUME CONTROL CIRCUIT

Yuksel Seler, Ankara, Turkey, assignor to Admiral Corporation, Chicago, Ill., a corporation of Delaware Application January 22, 1957, Serial No. 635,417

10 Claims. (Cl. 330—145)

This invention relates, generally, to automatic volume control circuits, and more particularly to a two-level volume control means which will provide for a relatively low volume output signal when the equipment is energized and will provide automatically for a relatively high volume output signal when the equipment is de-energized and then energized again.

Such a volume control means is particularly adaptable for use in clock radios, for example. It is often desirable to a person to have a radio play at a low volume level at night just before going to sleep. However, when the radio automatically turns on in the morning, it is usually desirable that the volume level be higher in order to wake up the sleeping person. There are, in the prior art, various devices which will accomplish this result. For example, lock-in type relays and attenuator networks have been employed. Such devices, however, are expensive.

An object of the present invention is an inexpensive and reliable circuit means which will establish a given volume level for the output signal of equipment such as a clock radio, for example, when the radio is energized, and a higher volume level when the radio is de-energized and then energized again.

Another object of the invention is the improvement of clock radios, generally.

A further object is the improvement of automatic volume control circuits, generally.

In accordance with the invention, there is provided an amplifier having an output circuit which includes a series combination of a load impedance and a D.-C. battery source. Circuit means comprising gas tube means are connected across a portion of said output circuit. The circuit parameters are selected so that the voltage supplied across the gas tube means is greater than the ionizing potential. Means are provided for initially causing ionization of said gas tube means. When the gas tube means is ionized, the impedance of the output circuit will be decreased, thus reducing the gain of the amplifier with respect to the gain thereof when the gas tube means is not ionized.

In accordance with a feature of the invention, the said gas tube means comprises a single gas tube, and the means for initially causing ionization of said gas tube means comprises a manually operated switch for momentarily applying an ionizing potential across said gas tube.

In accordance with another feature of the invention, the said gas tube means comprises a first gas tube and a second gas tube connected in series arrangement. The voltage applied thereacross is sufficient to ionize initially one of the gas tubes or to sustain ionization of both of the gas tubes, but is insufficient to ionize initially both of the gas tubes. The said means for initially causing ionization of the two gas tubes comprises a switch which, when closed, shunts out one of the gas tubes so that the voltage ordinarily applied across both gas tubes is now applied across but one of the gas tubes. This voltage is of sufficient magnitude to ionize said one gas tube. Upon release of the switch the voltage supplied across the non-ionized tube will be increased due to the decrease in the voltage existing across the ionized tube. This increased voltage is sufficient to ionize said non-ionized tube. Thus both gas tubes will be ionized with a consequent reduction in the effective load impedance and a resultant reduction in gain. When the amplifier is de-energized and then energized again, the gas tube means again will be in a non-ionized condition and the gain again will be at its high level.

The above-mentioned and other objects and features of the invention will become more fully understood from the following detailed description thereof when read in conjunction with the drawings, in which.

Figure 1:
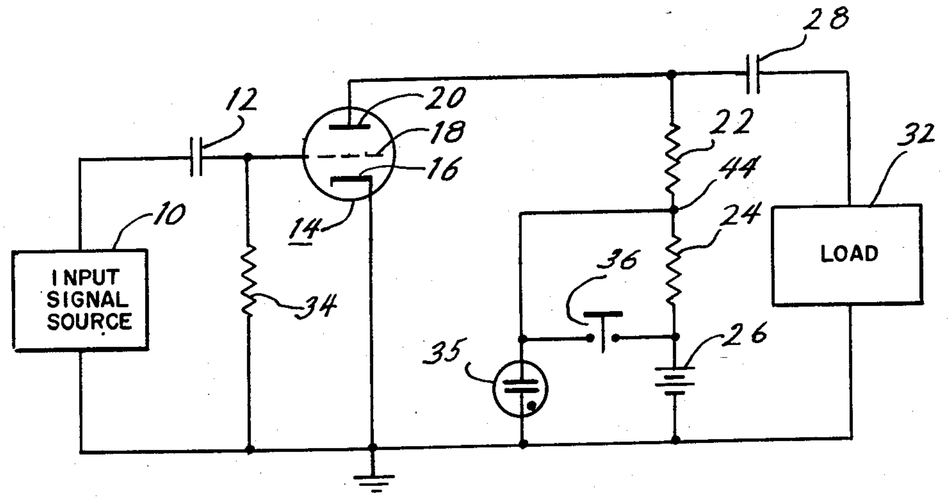
Fig. 1 is a schematic sketch of one form of the invention.

Referring now to Fig. 1, the input signal, which may be an audio signal, is supplied from the input signal source to the control grid 18 of the vacuum tube 14 through an appropriate circuit such as the grid leak circuit comprising capacitor 12 and resistor 34. The tube 14 further comprises a plate 20 and a cathode 16. Resistors 24 and 22 connect the positive terminal of the battery 26 to the plate 20 of tube 14 and form the plate load impedance for the plate current of the tube 14. The A.-C. component of the plate current of the tube 14 is coupled also to a utilization means 32 through coupling capacitor 28.

The gas tube 35 is connected between the point 44 and the cathode 16. During normal operation of the tube 14 the magnitude of the D.-C. plate current flow through the resistor 24 will be such that the potential difference between the point 44 and the cathode 16 (ground potential) is sufficient to sustain ionization of the gas tube 35 once the tube is ionized, but is insufficient to initiate ionization. Momentary closure of the switch 36, however, will increase the potential across the tube 35 by applying the battery source 26 directly thereacross. This increased applied potential is sufficient to ionize the gas tube 35. If the switch 36 is now released, the potential existing between the point 44 and the cathode 16 is sufficient to sustain ionization of the tube 35. Ionization of tube 35 will decrease the effective plate load impedance of the tube 14, thus decreasing the gain of the tube 14. If the circuit being discussed is being used as an amplifier in a clock-radio, the volume of the sound output will be decreased in accordance with the loss of gain. As stated hereinbefore, a low volume is usually desirable at night, while the listener is lying in bed awaiting sleep.

Sometime, thereafter, the radio will be turned off automatically for the rest of the night, at some preset time, and then will be turned on again automatically in the morning. However, when the radio is turned on in the morning the gas tube 35 will not become ionized. Thus the volume will be at a higher level than it was the night before.

Figure 2:
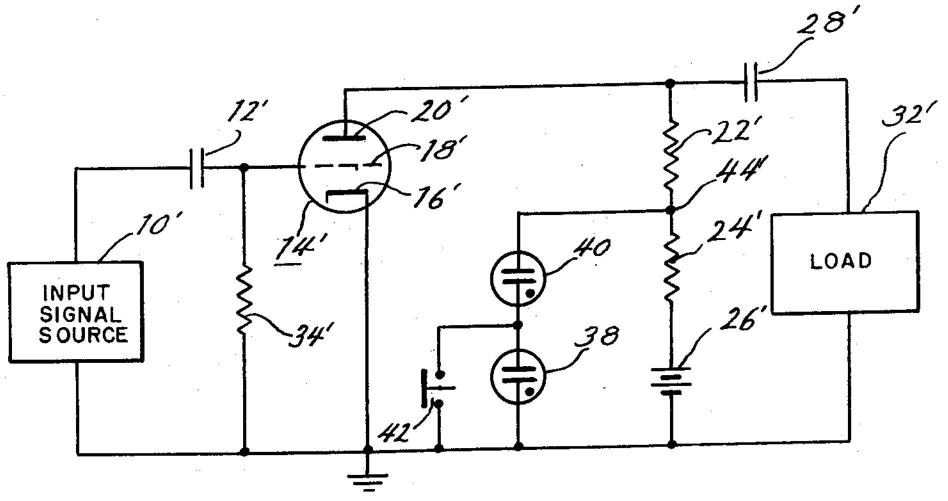
Fig. 2 illustrates a schematic sketch of another form of the invention.

Referring now to Fig. 2, there is shown another embodiment of the invention comprising some elements which correspond to elements in the circuit of Fig. 1. These corresponding elements are given similar reference characters, although primed in Fig. 2. More specifically, input signal source 10′, capacitor 12′, the tube 14′, including cathode 16′, control grid 18′, and plate 20′, the resistors 22′, and 24′, the point 44′, the battery source 26′, the capacitor 28′ and the utilization means 32′, all have corresponding elements in the circuit of Fig. 1, which are identified by the same reference characters (unprimed).

In Fig. 2 the automatic volume control circuit comprises the gas tubes 38 and 40, and the switch 42. The gas tubes 38 and 40 are connected in series-arrangement between the point 44′ and the cathode 16′ of the tube 14′. The circuit constants are selected so that the potential existing between the point 44′ and the cathode 16′ is sufficient to sustain ionization of the two gas tubes, but is insufficient to initiate ionization of the two gas tubes. If, however, the switch 42 is closed momentarily, the entire voltage existing between the point 44′ and the cathode 16′ will be applied across the gas tube 40 and will cause ionization thereof. The voltage across the gas tube 40 will then decrease to the magnitude necessary to sustain ionization. If, now, the switch 42 is opened, the total voltage impressed across the ionized gas tube 40 and the non-ionized gas tube 38 will divide therebetween in such a manner that the voltage across the gas tube 38 will be large enough to cause ionization thereof. Thus, both gas tubes will be ionized. As was described with respect to the circuit of Fig. 1, the effective plate load impedance of the tube 14′ thereby is decreased, thus decreasing the gain of the circuit. If the circuit of Fig. 2 is de-energized the gas tubes 38 and 40 will become extinguished and will remain so until the circuit is re-energized and the switch 42 is closed again.

Figure 3:
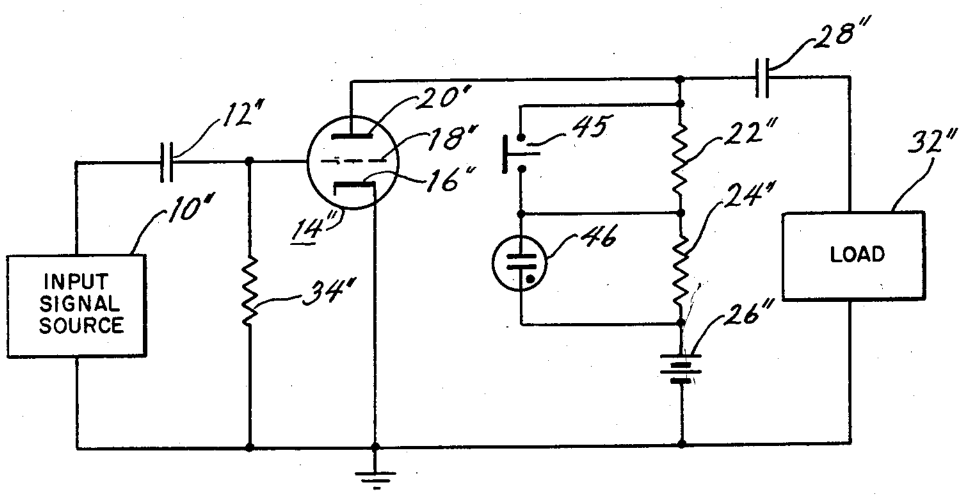
Fig. 3 is a schematic sketch of a third form of the invention.

Referring now to Fig. 3, there is shown another embodiment of the invention. As in the case of Fig. 2, certain elements of the circuit shown in Fig. 3 correspond to certain elements of the circuit of Fig. 1, and are identified by the same reference characters (double primed).

The automatic volume control circuit comprises the gas tube 46 and the manually operable switch 45. When the switch 45 is opened, as it normally is, the voltage appearing across the resistor 24″ is impressed across the tube 46. This voltage is of insufficient magnitude to ionize the tube 46, but is of sufficient magnitude to sustain ionization thereof. When the switch 45 is closed momentarily the resistor 22″ will be shunted thereby and the voltage appearing across the resistor 24″ will be increased. This increased voltage will be sufficient to ionize the tube 46. When the switch 45 is opened the energy supplied to the parallel combination of the tube 46 and the resistor 24″ will be sufficient to maintain ionization of the gas tube 46.

Figure 4:
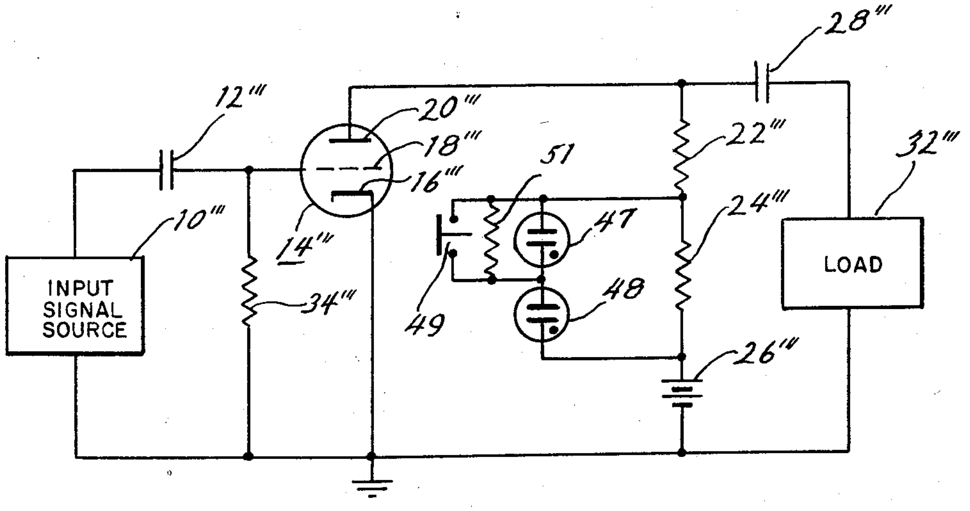
Fig. 4 shows a schematic sketch of a fourth form of the invention.

Referring now to Fig. 4, there is shown a fourth embodiment of the invention. Elements of the circuit of Fig. 4, which correspond to elements of the circuit of Fig. 1, are identified by similar reference characters (triple primed).

The automatic volume control circuit comprises the gas tubes 47 and 48, and the manually operable switch 49. When the switch 49 is open, as it normally is, the voltage appearing across the resistor 24‴ is impressed across the two gas tubes 47 and 48, which are connected in series-arrangement. The circuit constants are selected so that the voltage appearing across the resistor 24‴ is of insufficient magnitude to ionize the series-arrangement of the two tubes, but is of sufficient magnitude to sustain ionization. When the switch 49 is closed the entire difference of potential appearing across the resistor 24‴ is applied across the gas tube 48 and will ionize said gas tube. When the switch 49 is opened the total voltage impressed across the gas tubes 47 and 48 will be divided therebetween in such a ratio that the voltage across the gas tube 47 will be sufficient to ionize said tube. Thus, both tube 47 and tube 48 will be ionized to shunt out the resistor 24‴, which forms a part of the plate load resistor for the tube 14‴. To aid in maintaining ionization of the gas tube 48 until the tube 47 becomes ionized, the resistor 51 may be connected across the tube 47. The resistor 51 provides a path for the current flowing through the tube 48 during the short interval of time between the opening of the switch 49 and the ionizing of the tube 47. A similarly connected resistor may be used in the circuit of Fig. 2 (although not specifically shown therein).

It is to be noted that the switches 36, 42, 45, and 49 may be of the type which may be closed by manual force, and then, when the manual force is released, will reopen automatically. More specifically, the switches 36, 42, 45, and 49 may be push-button switches located on the cabinet of the clock-radio along with the other various controls.

It will be noted although many of the circuit components of the circuits shown in Figs. 1, 2, 3, and 4 correspond and are identified by the same reference characters (primed in successive degrees in different figures) nevertheless the values thereof can vary with the embodiment of the invention employed and must be determined in accordance therewith. However, such determinations of circuit constants are but a matter of design and will not be discussed in detail herein.

It is to be noted, further, that the forms of the invention herein shown and described are but preferred embodiments of the same, and that various changes may be made in the circuit arrangement thereof without departing from the spirit or scope of the invention.

I claim:

1. In an amplifier comprising an electron valve having an electron emitting electrode, an electron collecting electrode, and a control electrode, a series combination of a battery source and load impedance means connected between said electron collecting electrode and said electron emitting source, gas tube means connected across a portion of said series combination, said portion of said series combination having a voltage drop thereacross which is greater than the sustaining voltage of said gas tube means but is less than the firing voltage of said gas tube means, and means including switching means for initially ionizing said gas tube means.

2. An amplifier in accordance with claim 1, in which said gas tube means comprises a single gas tube connected across a portion of said load impedance, and in which said switching means connects a greater portion of said load impedance across said gas tube means.

3. An amplifier in accordance with claim 1, in which said gas tube means comprises a single gas tube connected across said battery source and a portion of said load impedance, and in which said switching means upon closure thereof provides a shunt circuit for a portion of said load impedance, thereby increasing the voltage drop across said gas tube.

4. An amplifier in accordance with claim 1, in which said gas tube means comprises two gas tubes connected in series arrangement across a portion of said load impedance, the first of said gas tubes having an ionizing potential less than the said voltage drop across said portion of said series combination and the second gas tube having an ionizing potential less than the difference between said voltage drop and the sustaining voltage of the first gas tube, and in which said switching means is operable to provide a shunt circuit across the second of said gas tubes.

5. In an amplifier comprising an electron valve having an electron emitting electrode, an electron collecting electrode, and a control electrode, a series combination of a battery source and load impedance means connected between said electron collecting electrode and said electron emitting source, gas tube means connected across a portion of said series combination including said battery source and a portion of the load impedance means, said portion of said series combination having a potential drop thereacross greater than the sustaining potential of said gas tube means but less than the firing potential of said gas tube means, and means including switching means for initially ionizing said gas tube means.

6. In an amplifier comprising an electron discharge device having a plate, a cathode, and a control grid and a series combination of a D.-C. voltage source and plate circuit load impedance connected between said cathode and said plate, means for automatically increasing the gain of the amplifier after de-energization of said amplifier and upon subsequent re-energization of said amplifier comprising gas tube means connected across a portion of said series combination, said portion of said series combination having a voltage drop thereacross which is greater than the sustaining voltage of said gas tube means but less than the firing voltage of said gas tube means, and means including switching means for initially causing ionization of said gas tube means.

7. An amplifier in accordance with claim 6, in which said gas tube means comprises a single gas tube connected across a portion of said load impedance, and in which said switching means is operable to connect a greater portion of said plate circuit load impedance across said gas tube means.

8. An amplifier in accordance with claim 6, in which said gas tube means comprises a single gas tube connected across said D.-C. voltage source and a portion of said plate circuit load impedance, and in which said switching means is operable to short circuit at least a part of said portion of said plate circuit load impedance.

9. An amplifier in accordance with claim 6, in which said gas tube means comprises two gas tubes connected in series arrangement across said D.-C. voltage source and a portion of said load impedance, a first of said gas tubes having an ionizing potential less than the said voltage drop across said portion of said series combination and the second of said gas tubes having an ionizing potential less than the difference between said voltage drop and the sustaining voltage of said first gas tube, and in which said switching means is operable to provide a shunt circuit across said second gas tube.

10. An amplifier in accordance with claim 6, in which said gas tube means comprises two gas tubes connected in series arrangement across a portion of said plate circuit load impedance, the first of said gas tubes having an ionizing potential less than the said voltage drop across said portion of said series combination and the second gas tube having an ionizing potential less than the difference between said voltage drop and the sustaining voltage of the second gas tube, and in which said switching means is operable to provide a shunt circuit across the second of said gas tubes.

References Cited in the file of this patent

UNITED STATES PATENTS

| | | |
|---|---|---|
| 2,021,034 | Thompson | Nov. 12, 1935 |
| 2,572,832 | Bernard | Oct. 30, 1951 |
| 2,575,358 | Nuckolls | Nov. 20, 1951 |
| 2,685,619 | Orlando | Aug. 3, 1954 |